(12) United States Patent
Lee et al.

(10) Patent No.: US 10,790,224 B2
(45) Date of Patent: Sep. 29, 2020

(54) CARRIER SUBSTRATE AND METHOD OF MANUFACTURING SEMICONDUCTOR PACKAGE USING THE SAME

(71) Applicant: SAMSUNG ELECTRONICS CO., LTD., Suwon-si (KR)

(72) Inventors: Jae Ean Lee, Suwon-si (KR); Tae Sung Jeong, Su-won-si (KR); Young Gwan Ko, Suwon-si (KR); Ik Jun Choi, Suwon-si (KR); Jung Soo Byun, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/399,540

(22) Filed: Apr. 30, 2019

(65) Prior Publication Data

US 2019/0259697 A1 Aug. 22, 2019

Related U.S. Application Data

(63) Continuation of application No. 15/919,507, filed on Mar. 13, 2018.

(30) Foreign Application Priority Data

Nov. 28, 2017 (KR) .................. 10-2017-0160577

(51) Int. Cl.
*H01L 21/00* (2006.01)
*H01L 23/498* (2006.01)
(Continued)

(52) U.S. Cl.
CPC ...... *H01L 23/49838* (2013.01); *H01L 21/561* (2013.01); *H01L 21/78* (2013.01);
(Continued)

(58) Field of Classification Search
CPC .............. H01L 23/49838; H01L 21/78; H01L 23/53228; H01L 23/15; H01L 21/561; H01L 2221/68318
(Continued)

(56) References Cited

U.S. PATENT DOCUMENTS 6,866,255 B2 * 3/2005 Fork ...................... C23C 14/14
257/181
6,912,082 B1 * 6/2005 Lu ....................... B81C 1/00246
257/E27.112
(Continued)

FOREIGN PATENT DOCUMENTS

JP 2004-235323 A 8/2004
JP 2011-138869 A 7/2011
(Continued)

OTHER PUBLICATIONS

Communication dated Jul. 29, 2019 issued by the Taiwan Intellectual Property Office in counterpart Taiwan Application No. 107108285.
(Continued)

*Primary Examiner* — Vu A Vu
(74) *Attorney, Agent, or Firm* — Sughrue Mion, PLLC

(57) ABSTRACT

A carrier substrate comprises a core layer, a first metal layer disposed on the core layer, a release layer disposed on the first metal layer, and a second metal layer disposed on the release layer. At least one layer among the first metal layer, the release layer, and the second metal layer is disposed in a plurality of unit pattern portions having an area smaller than an area of the core layer. In addition, a method of manufacturing a semiconductor package using the carrier substrate is provided.

18 Claims, 17 Drawing Sheets

(51) Int. Cl.
*H01L 23/15* (2006.01)
*H01L 21/56* (2006.01)
*H01L 23/532* (2006.01)
*H01L 21/78* (2006.01)

(52) U.S. Cl.
CPC ........ *H01L 23/15* (2013.01); *H01L 23/49822* (2013.01); *H01L 23/53228* (2013.01); *H01L 23/49816* (2013.01); *H01L 2221/68318* (2013.01)

(58) Field of Classification Search
USPC .......................................................... 438/106
See application file for complete search history.

(56) References Cited

U.S. PATENT DOCUMENTS

| | | | |
|---|---|---|---|
| 7,528,618 B2* | 5/2009 | Gritters | G01R 1/06738 324/755.11 |
| 7,601,236 B2 | 10/2009 | Yamashita et al. | |
| 7,713,369 B2 | 5/2010 | Aspar et al. | |
| 8,415,208 B2* | 4/2013 | Takayama | H01L 21/76251 438/149 |
| 8,580,608 B2* | 11/2013 | Hsu | H01L 21/561 257/E21.499 |
| 8,749,063 B2 | 6/2014 | Tsurume | |
| 9,397,062 B2 | 7/2016 | Huang et al. | |
| 9,735,398 B2 | 8/2017 | Aoyama et al. | |
| 2004/0211751 A1 | 10/2004 | Shuto et al. | |
| 2009/0246929 A1 | 10/2009 | Margomenos | |
| 2010/0110157 A1 | 5/2010 | Yonehara et al. | |
| 2010/0200970 A1 | 8/2010 | Zhang | |
| 2011/0155443 A1 | 6/2011 | Maeda et al. | |
| 2013/0143062 A1 | 6/2013 | Kaneko et al. | |
| 2013/0341784 A1 | 12/2013 | Lin et al. | |
| 2014/0096381 A1 | 4/2014 | Tateoka | |
| 2015/0044792 A1 | 2/2015 | Aoyama et al. | |
| 2015/0137297 A1 | 5/2015 | Boettiger | |
| 2015/0156877 A1 | 6/2015 | Kang et al. | |
| 2015/0231858 A1 | 8/2015 | van Neer | |
| 2017/0311450 A1 | 10/2017 | Huang | |

FOREIGN PATENT DOCUMENTS

| | | |
|---|---|---|
| JP | 2013-21294 A | 7/2011 |
| JP | 2013-21294 A | 1/2013 |
| JP | 2013-120771 A | 6/2013 |
| JP | 2015-063096 A | 4/2015 |
| KR | 10-0939929 B1 | 2/2010 |
| KR | 10-1321185 B1 | 10/2013 |
| KR | 10-2015-0062556 A | 6/2015 |
| KR | 10-2015-0063471 A | 6/2015 |
| KR | 10-2016-0040513 A | 4/2016 |
| KR | 10-2016-0060937 | 5/2016 |
| WO | 2017/078849 A1 | 5/2017 |

OTHER PUBLICATIONS

Office Action issued in corresponding Korean Patent Application No. 10-2017-0160577 dated Jan. 30, 2019, with English translation.
Office Action issued in corresponding Japanese Application No. 2018-044712 dated Jan. 29, 2019, with English translation.
Office Action issued in Taiwanese Patent Application No. 10721235270 dated Dec. 28, 2018, with English translation.
Non-Final Office Action issued in corresponding U.S. Appl. No. 15/919,507, dated Feb. 28, 2019.
Communication dated Oct. 13, 2019 issued by the Korean Intellectual Property Office in counterpart Korean Application No. 10-2017-0160577.

* cited by examiner

CARRIER SUBSTRATE AND METHOD OF MANUFACTURING SEMICONDUCTOR PACKAGE USING THE SAME

CROSS-REFERENCE TO RELATED APPLICATION

This application claims the benefit of priority to U.S. patent application Ser. No. 15/919,507 filed on Mar. 13, 2018 and Korean Patent Application No. 10-2017-0160577 filed on Nov. 28, 2017 with the Korean Intellectual Property Office, the entirety of which both are incorporated herein by reference.

BACKGROUND

The present disclosure relates to a semiconductor package including an organic interposer electrically connecting a plurality of semiconductor chips disposed in a side by side manner through an interposer.

The interposer market has grown, due to the increased use of high-end component sets and the employment of high bandwidth memory (HBM). Currently, silicon (Si) is commonly used as a material of an interposer, but methods of using glass or organic substrates have been developed to provide a large surface area at relatively low cost.

In the meantime, in order to meet the recent demand for a fine pad pitch of tens of micrometers, a die-to-die microcircuit line is required to be miniaturized to have a size of several micrometers. To this end, carriers securing improved flatness, as compared with the related art, are required.

In addition, in a process of manufacturing a semiconductor package including an interposer using a carrier, an interposer may be formed to have a panel size, and then, for example, to have a quad size to improve the quality of a packaging process. In this case, there may be a problem in which carriers are separated during a process of sawing a panel to have a quad size. Thus, a separation prevention design to prevent such separation is required.

SUMMARY

An aspect of the present disclosure provides a new type of carrier substrate in which a separation prevention design is adopted. A method of manufacturing a semiconductor package using the same is also provided.

According to an aspect of the present disclosure, a metal layer and a release layer are disposed on a core layer, such as glass, to be detachable, while the metal layer and the release layer are patterned to have an area smaller than that of the core layer.

According to an aspect of the present disclosure, a carrier substrate includes a core layer, a first metal layer disposed on the core layer, a release layer disposed on the first metal layer, and a second metal layer disposed on the release layer. At least one layer among the first metal layer, the release layer, and the second metal layer is disposed in a plurality of unit pattern portions having an area smaller than that of the core layer.

According to an aspect of the present disclosure, a method of manufacturing a semiconductor package includes providing a carrier substrate including a core layer, a first metal layer disposed on the core layer, a release layer disposed on the first metal layer, and a second metal layer disposed on the release layer. At least one layer among the first metal layer, the release layer, and the second metal layer forms a plurality of unit pattern portions having an area smaller than an area of the core layer. The method further includes forming an interposer on each unit pattern of the plurality of unit pattern portions, and separating the carrier substrate and the interposer between the plurality of unit pattern portions to isolate the plurality of unit pattern portions from each other. The method further includes disposing a plurality of semiconductor chips on the interposer of each unit pattern portion having been separated, and forming an encapsulant on the interposer of each respective unit pattern portion having been separated to encapsulate the plurality of semiconductor chips on each interposer. Each carrier substrate having been separated and having the encapsulant are trimmed, to allow one or more of the plurality of semiconductor chips to be isolated from each other. Each unit pattern portion that has been trimmed from each interposer is separated.

According to an aspect of the present disclosure, a carrier substrate can include a core layer and a plurality of unit pattern portions disposed on the core layer to be spaced apart from each other. Each unit pattern portion includes a release layer and metal layers disposed on a surface of the release layer facing away from the core layer.

According to an aspect of the present disclosure, a method can include forming a first metal layer on an upper surface of a core layer, forming a release layer on an upper surface of the first metal layer, and forming a second metal layer to cover an entire upper surface of the release layer. The release layer and second metal layer are patterned to form unit pattern portions spaced apart from each other, and the method further includes cutting the core layer having the first metal layer, release layer, and second metal layer formed thereon at locations between the unit pattern portions.

BRIEF DESCRIPTION OF DRAWINGS

The above and other aspects, features, and advantages of the present disclosure will be more clearly understood from the following detailed description when taken in conjunction with the accompanying drawings, in which.

DETAILED DESCRIPTION

Hereinafter, embodiments of the present disclosure will be described as follows with reference to the attached drawings. The contents of the present disclosure described below may have a variety of configurations, and only a preferred configuration is proposed herein, but the present disclosure is not limited thereto.

Electronic Device

Figure 1:
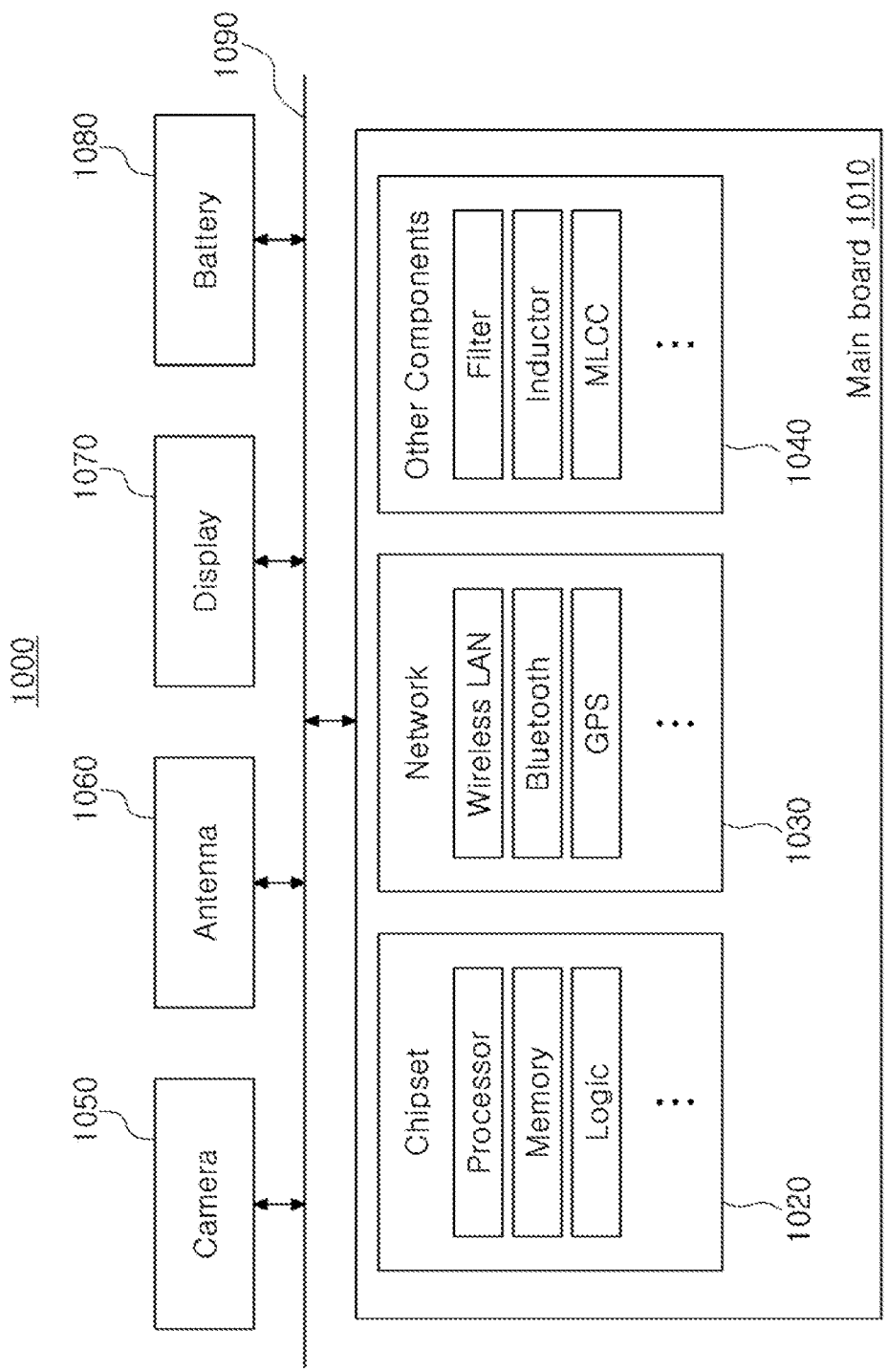
FIG. 1 is a schematic block diagram of an exemplary electronic device system.

FIG. 1 is a schematic block diagram of an exemplary embodiment of an electronic device system.

With reference to FIG. 1, an electronic device 1000 may accommodate a mainboard 1010. In the mainboard 1010, a chip or chipset component 1020, a network component 1030, and other components 1040 may be physically and/or electrically connected to each other. The chip component 1020, the network component 1030, and other components 1040 may be combined with other components to be subsequently described to form various signal lines 1090.

The chip component 1020 may include a memory chip, such as a volatile memory (e.g., a dynamic random-access memory (DRAM)), a non-volatile memory (e.g., a read-only memory (ROM)), and a flash memory; an application processor chip, such as a central processor (e.g., a central processing unit (CPU)), a graphics processor (e.g., a graphics processing unit (GPU)), a digital signal processor, a cryptography processor, a microprocessor, and a microcontroller; a logic chip, such as an analog-to-digital converter and application-specific ICs (ASICs), but is not limited thereto. In addition, other types of chip components may be included therein. Furthermore, the chip components 1020 may be combined with each other.

The network component 1030 may be configured for use with Wi-Fi (IEEE 802.11 family, or the like), WiMAX (IEEE 802.16 family, or the like), IEEE 802.20, long term evolution (LTE), Ev-DO, HSPA+, HSDPA+, HSUPA+, EDGE, GSM, GPS, GPRS, CDMA, TDMA, DECT, Bluetooth, 3G, 4G, 5G, and other wireless/wired protocols, but is not limited thereto. In addition, the network component 1030 may be configured for use with any of a plurality of different wireless standards, wired standards, or protocols. Furthermore, the network component 1030 may be combined with the chip component 1020.

The other components 1040 may include a high frequency inductor, a ferrite inductor, a power inductor, ferrite beads, low temperature co-fired ceramics (LTCC), an electromagnetic interference (EMI) filter, a multilayer ceramic capacitor (MLCC), or the like, but is not limited thereto. In addition, the other components 1040 may include passive components used for various different applications. Furthermore, the other components 1040 may be combined with the chip or chipset component 1020 and/or the network component 1030.

According to a type of the electronic device 1000, the electronic device 1000 may include one or more different component (s) which may or may not be physically and/or electrically connected to the motherboard 1010. For example, the different component(s) may include a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage device (e.g., a hard disk drive) (not illustrated), a compact disk (CD) (not illustrated), a digital versatile disk (DVD) (not illustrated), or the like, but is not limited thereto. In addition, the different component(s) may include a different component, or the like, used for various applications, according to a type of the electronic device 1000.

The electronic device 1000 may be provided as a smartphone, a personal digital assistant (PDA), a digital video camera, a digital still camera, a network system, a computer, a monitor, a tablet PC, a laptop computer, a netbook, a television, a videogame console, a smartwatch, an automobile, or the like, but is not limited thereto. In addition, the electronic device 1000 may be provided as a different electronic device processing data.

Figure 2:
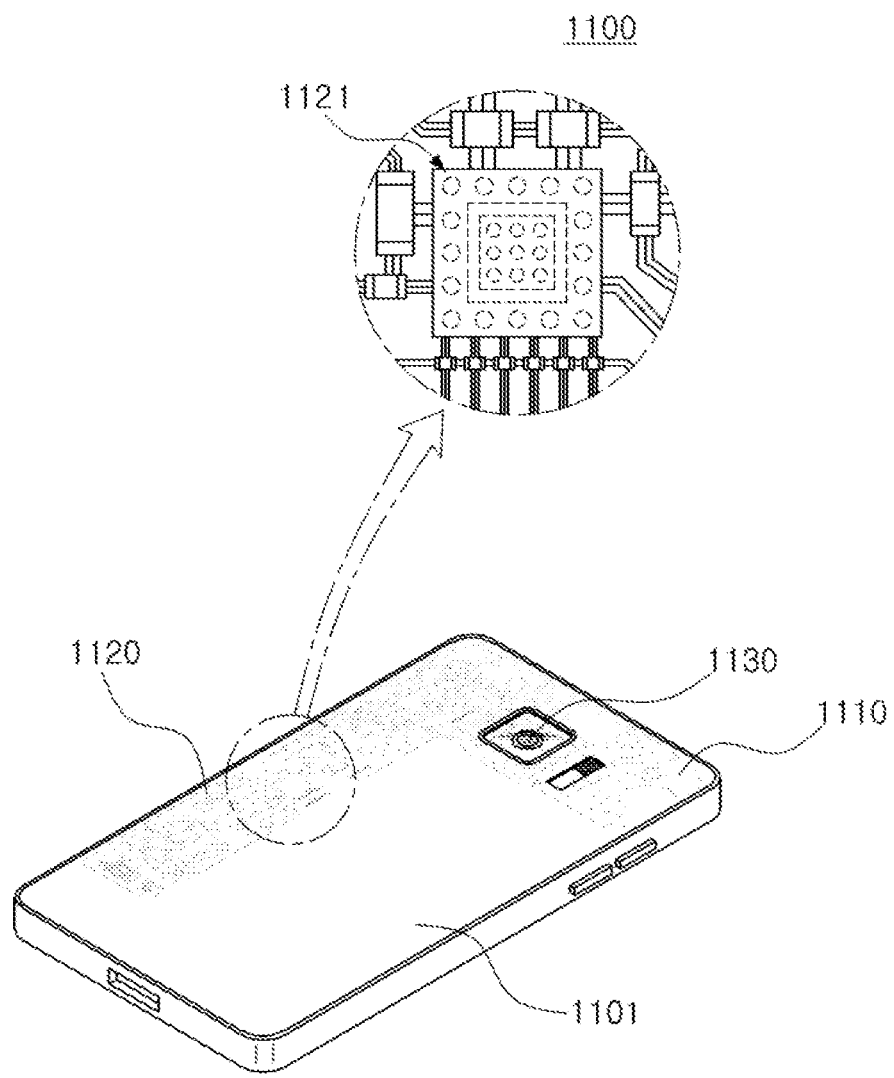
FIG. 2 is a schematic perspective view of an exemplary electronic device.

FIG. 2 is a schematic perspective view of an exemplary embodiment of an electronic device.

With reference to FIG. 2, a semiconductor package including an organic interposer may be applied to various electronic devices described above in order to be used for various applications within the electronic device. In detail, a smartphone 1100 may include a motherboard 1110 disposed in a body 1101 thereof, while the motherboard 1110 may include a variety of components 1120 physically and/or electrically connected to each other. In addition, a different component, such as a camera module 1130, which may or may not be physically and/or electrically connected to the motherboard 1110, may be included in the body 1101. A portion of a component 1120 may be provided as a chip component, while a portion thereof may be provided as an interposer package 1121. The electronic device may not be limited to the smartphone 1100, but may be provided as a different electronic device.

Semiconductor Package Including Interposer

In general, a semiconductor chip may include a large number of microelectronic circuits integrated therein, but the semiconductor chip is unable to function as a finished semiconductor product, and there is a possibility that the semiconductor chip may be damaged by external physical or chemical impacts. Therefore, the semiconductor chip is not used by itself, but is used in an electronic device, or the like, in such a manner that the semiconductor chip is packaged.

Semiconductor packaging is commonly used when there is a difference in a circuit width between the semiconductor chip and a mainboard of the electronic device from the viewpoint of an electrical connection. In detail, in the case of the semiconductor chip, a size of the connection pad and an interval between connection pads may be significantly small. In the case of the mainboard used in the electronic device, a size of a component mounting pad and an interval between component mounting pads may be significantly larger than a scale of the semiconductor chip. Therefore, it is difficult to directly mount the semiconductor chip on the mainboard, and a packaging technique for offsetting a difference in a circuit width therebetween is used to ensure proper electric connections between connection pads of the semiconductor chip and mainboard.

Hereinafter, a semiconductor package including an interposer manufactured using the packaging technique will be described in more detail with reference to the drawings.

Figure 3:
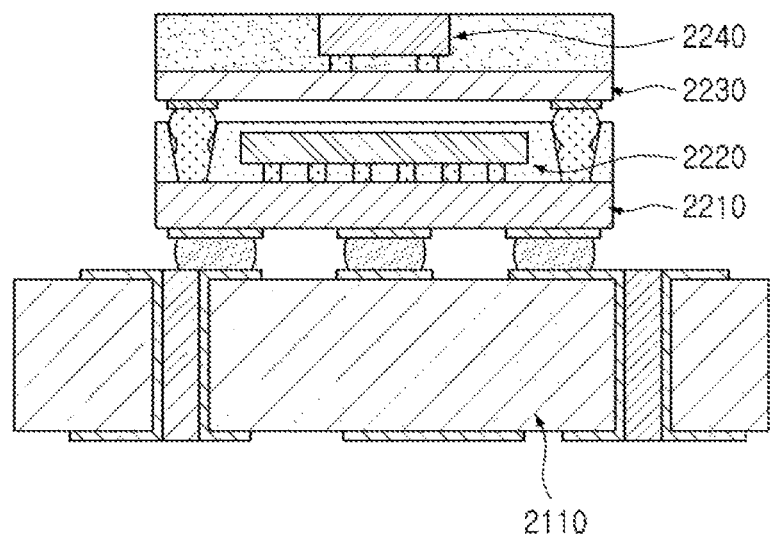
FIG. 3 is a schematic cross-sectional view of a 3D ball grid array (BGA) package mounted on a mainboard of the electronic device.

FIG. 3 is a schematic cross-sectional view of a 3D ball grid array (BGA) package mounted on a main board of an electronic device.

Since prices of respective chips of an application specific integrated circuit (ASIC), such as a graphic processing unit (GPU), among semiconductor chips, may be significantly high, it is critical to carry out packaging with a relatively high yield. To this end, a ball grid array (BGA) substrate 2210, or the like, able to redistribute thousands to hundreds of thousands of connection pads before the semiconductor chip is mounted thereon may first be provided. The same semiconductor device which is expensive, such as a GPU 2220, may be mounted and packaged on the BGA substrate 2210 using surface mounting technology (SMT) or the like, and then ultimately mounted on a mainboard 2110.

In the meantime, in the case of the GPU 2220, a signal path connected to a memory, such as a high bandwidth memory (HBM) is generally to be minimized. To this end, a semiconductor chip, such as the HBM 2240, may be mounted on an interposer 2230 to be packaged. Subsequently, the semiconductor chip may be stacked on a package on which the GPU 2220 is mounted to have a package on package (POP) form. However, in this case, there is a problem in which a thickness of a device may be significantly increased, and there is also a limitation in minimizing the signal path.

Figure 4:
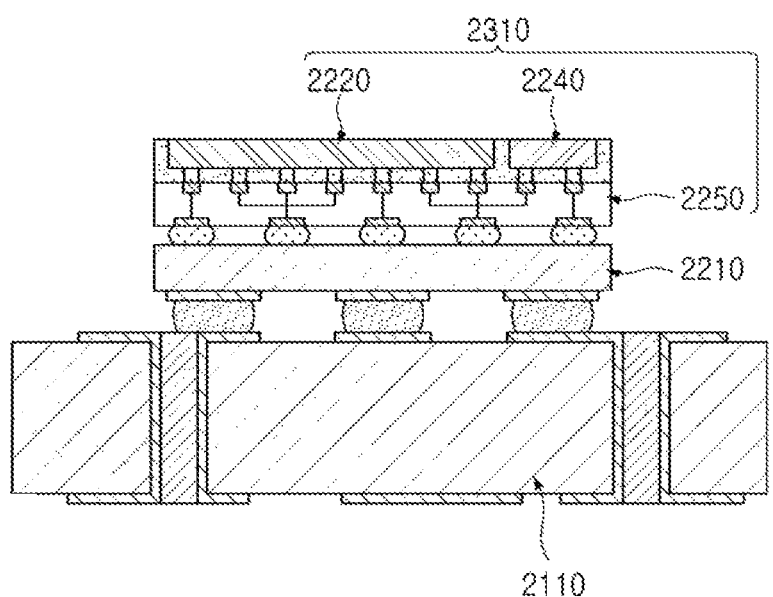
FIG. 4 is a schematic cross-sectional view of a 2.5D silicon interposer package mounted on the mainboard.

FIG. 4 is a schematic cross-sectional view of a 2.5D silicon interposer package mounted on a main board.

In order to solve the problems described above, a semiconductor package 2310 can be manufactured to include a silicon interposer using a 2.5D interposer technique. A first semiconductor chip, such as the GPU 2220, and a second semiconductor chip, such as the HBM 2240, can be surface mounted on a silicon interposer 2250 in a side by side manner to be packaged. In this case, the GPU 2220 and the HBM 2240, having thousands to hundreds of thousands of connection pads, may be redistributed through the silicon interposer 2250 and may be electrically connected by a shortest path. In addition, the semiconductor package 2310 including the silicon interposer can be mounted again on the BGA substrate 2210, or the like, to be redistributed, and the semiconductor package 2310 may ultimately be mounted on the mainboard 2110. However, in the case of the silicon interposer 2250, since formation of a through silicon via (TSV) is significantly difficult, and manufacturing costs are also considerable, it may be difficult to provide a large surface area at relatively low cost.

Figure 5:
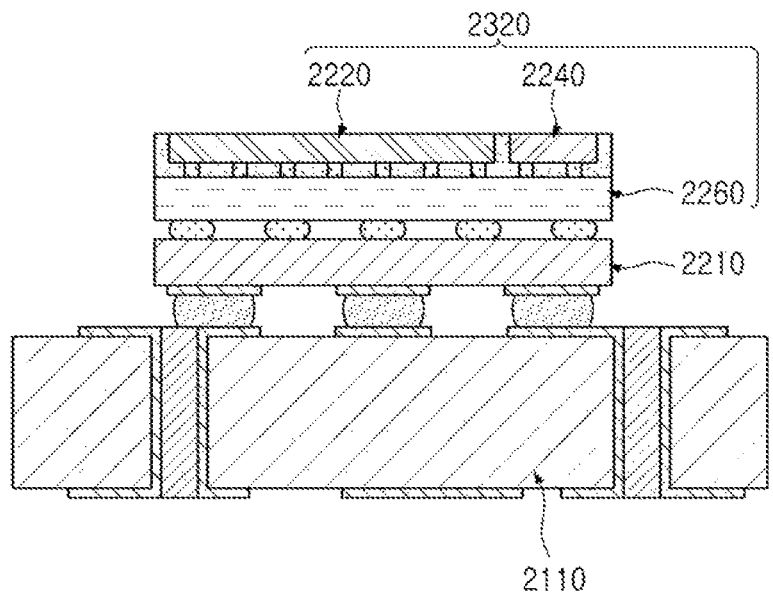
FIG. 5 is a schematic cross-sectional view of a 2.5D organic interposer package mounted on the mainboard.

FIG. 5 is a schematic cross-sectional view of a 2.5D organic interposer package mounted on a main board.

As a method of solving a problem described above, using an organic interposer 2260 may be considered, rather than a silicon interposer 2250. For example, a semiconductor package 2320 can be manufactured to include an organic interposer using a 2.5D interposer technique. A first semiconductor chip, such as a GPU 2220, and a second semiconductor chip, such as a HBM 2240, can be surfaced mounted on an organic interposer 2260 in a side by side manner to be packaged. In this case, the GPU 2220 and the HBM 2240, having thousands to hundreds of thousands of connection pads, may be redistributed through the organic interposer 2260 and may be electrically connected by a shortest path. In addition, in a case in which the semiconductor package 2320 including the organic interposer is mounted again on the BGA substrate 2210, or the like, to be redistributed, the semiconductor package 2320 may ultimately be mounted on the mainboard 2110. Furthermore, it may be easy to provide a large surface area at relatively low cost.

In the meantime, the semiconductor package 2320 including the organic interposer may be manufactured by performing a packaging process in which chips 2220 and 2240 are mounted on the organic interposer 2260 to be molded. Here, in a case in which a molding process is not performed, since the semiconductor package 2320 is not controlled, the semiconductor package 2320 may not be amenable to connection to the BGA substrate 2210. Thus, the semiconductor package 2320 may maintain rigidity through molding. However, in a case in which the molding process is performed, as described above, problems, such as the generation of warpage, deterioration in filling performance of a underfill resin, generation of cracking between a die and a molding material, may occur due to a mismatch in coefficients of thermal expansion (CTE) between the organic interposer 2260, the chips 2220 and 2240, and the molding material, or the like.

Figure 6:
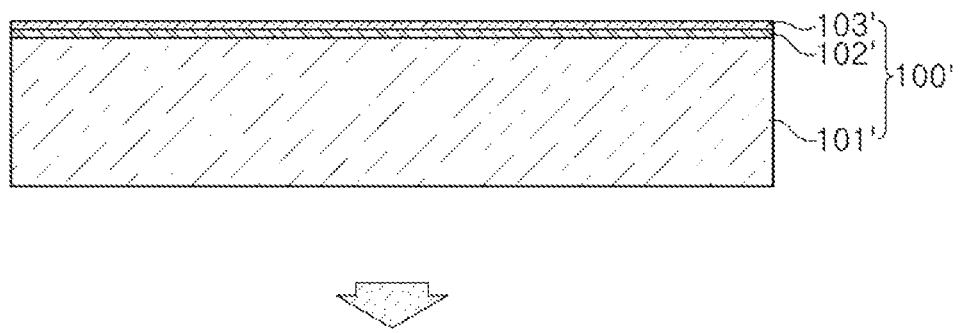
FIGS. 6 to 8 are schematic views of an exemplary method of manufacturing an organic interposer package.
Figure 6:
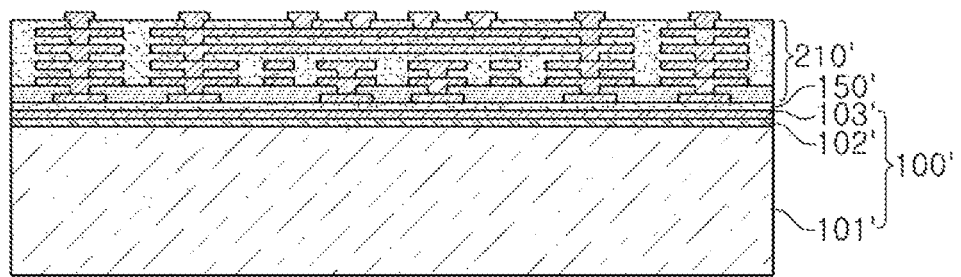
Figure 7:
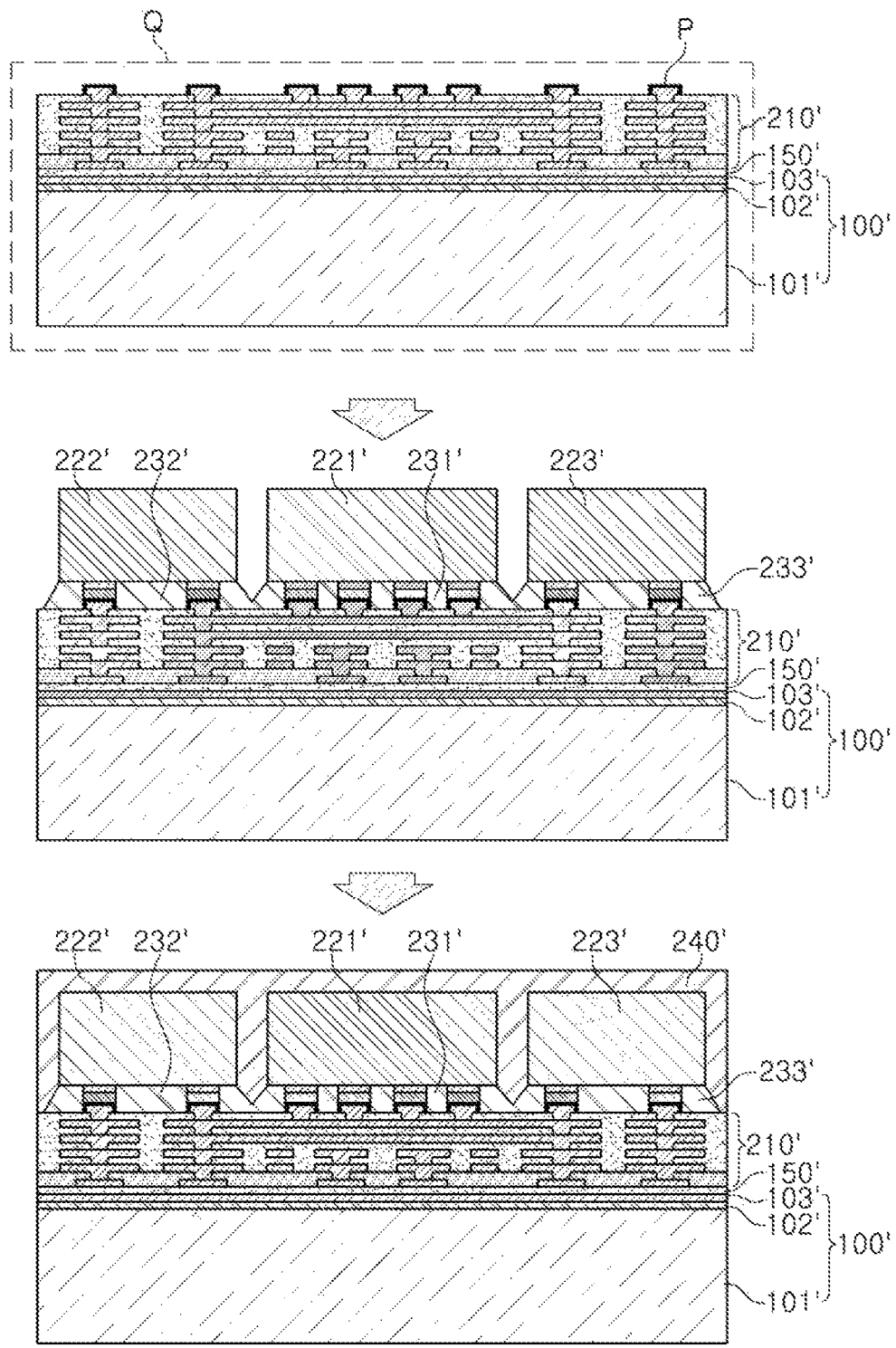
Figure 8:
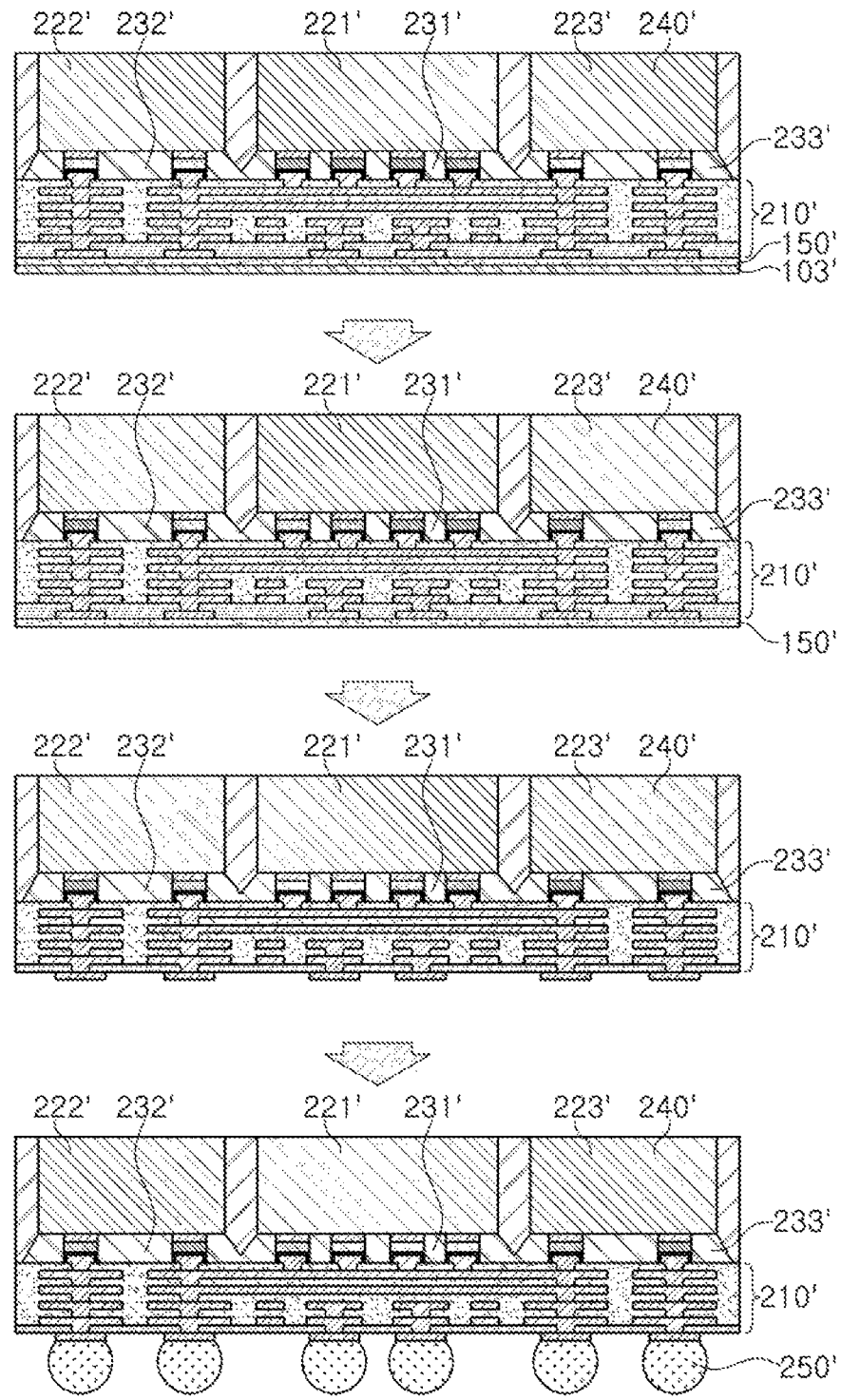

FIGS. 6 to 8 are schematic views of an exemplary method of manufacturing an organic interposer package.

With reference to FIG. 6, a carrier 100' may first be provided. The carrier 100' may include a core layer 101' and metal films 102' and 103', formed on the core layer 101'. The core layer 101' may be provided as, for example, a prepreg including an insulating resin, an inorganic filler, and a glass fiber, but is not limited thereto. The core layer 101' may also be provided as glass. Each of the metal films 102' and 103' may include a metal, such as copper (Cu) and titanium (Ti). Surfaces between the metal films 102' and 103' may be surface treated to facilitate separation. Alternatively, a bonding layer (not illustrated) may be provided therebetween. Subsequently, an organic interposer 210' may be formed on the carrier 100'. The organic interposer 210' may be formed using a method in which an insulating layer, such as an Ajinomoto build-up film (ABF) or a photo-imageable dielecric (PID), is formed, and a wiring layer and a via electrode are formed on the insulating layer using a plating technique. The wiring layer of the organic interposer 210' may be formed using a microcircuit. According to need, a resin layer 150' may be interposed between the carrier 100' and the organic interposer 210'. The resin layer 150' may function to electrically isolate the carrier 100' from the organic interposer 210'. In other words, in a case in which an electric inspection is performed on the wiring layer of the organic interposer 210', the resin layer 150' may be used to isolate the carrier 100' therefrom. The resin layer 150' may be formed in such a manner that a film-type precursor is laminated or a liquid-type precursor is coated to be cured. The resin layer 150' may be provided as the ABF, a PID resin, or the like, but is not limited thereto.

With reference to FIG. 7, a surface treatment layer P, or the like, may be formed on a surface of the wiring layer exposed on an uppermost side of the organic interposer 210'. In addition, a quad route inspection, an electric inspection of the wiring layer, or the like, may be performed. A panel may be cut to have a quad size using a sawing (Q) process so that a plurality of quad units may be obtained, which is not illustrated in detail in FIG. 7. In the meantime, in a case in which the carrier 100' is not separately designed to prevent separation during a quad sawing (Q) process, a defect in which the metal films 102' and 103' are separated may occur. Subsequently, semiconductor chips 221', 222', and 223' may be mounted. A connection member, such as a solder including a low melting point metal like as tin (Sn) may be used in mounting the semiconductor chips 221', 222', and 223'.

Subsequently, the semiconductor chips 221', 222', and 223' may be fixed using underfill resins 231', 232', and 233'. Subsequently, an encapsulant 240' encapsulating the semiconductor chips 221', 222', and 223' may be formed on the organic interposer 210'. The encapsulant 240' may be formed in such a manner that a film-type precursor is laminated or a liquid-type precursor is coated and cured. In the meantime, after the encapsulant 240' is formed, a trimming process may be performed on an intermediate product to have a package size so that a plurality of semiconductor packages may be obtained, which is not illustrated in detail in FIG. 7.

With reference to FIG. 8, the encapsulant 240' may be ground so that an inactive surface of each of (or at least one of) the semiconductor chips 221', 222', and 223' may be exposed. An upper surface of each of the semiconductor chips 221', 222', and 223' may be disposed on the same level by grinding. In other words, thicknesses of the semiconductor chips 221', 222', and 223' may be substantially equal. In addition, the carrier 100' may be separated from the core layer 101'. Separation of the carrier 100' may be performed by separation of the metal films 102' and 103'. In this case, a remaining metal film 103' may be removed using an etching process. After the separation thereof, the resin layer 150' may be removed by grinding, or the like, according to need. Subsequently, an electrical connection structure 250' may be attached thereto, and a reflow process, or the like, may be performed. A plurality of semiconductor packages including an organic interposer may be manufactured using a series of processes.

Carrier Substrate

Hereinafter, a carrier substrate on which a separation prevention design used in manufacturing a package substrate including an organic interposer described above is performed will be described in more detail with reference to the drawings.

Figure 9:
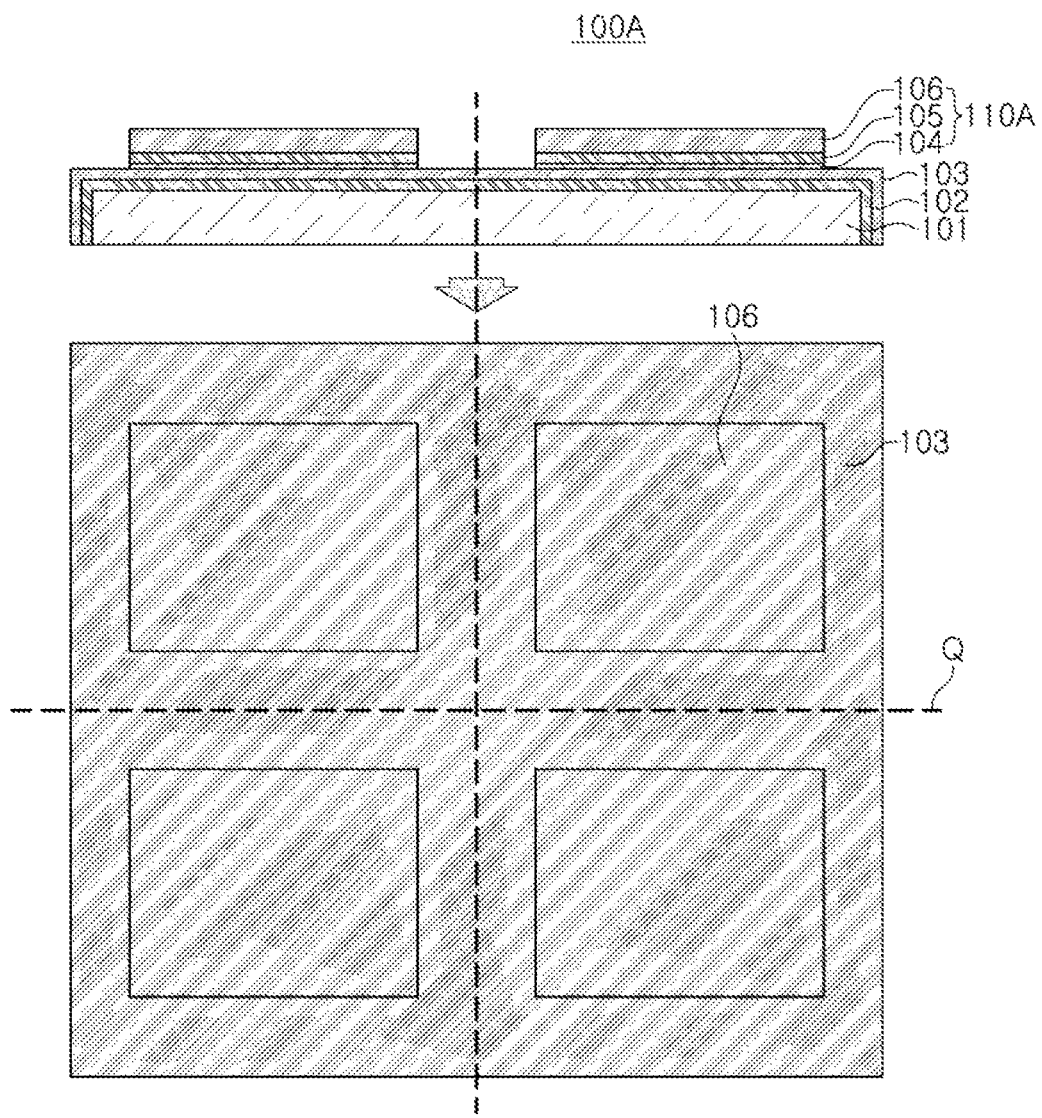
FIG. 9 is a schematic cross-sectional view and top view of an exemplary carrier substrate.

FIG. 9 is a schematic cross-sectional view and top view of an exemplary embodiment of a carrier substrate.

With reference to FIG. 9, a carrier substrate 100A according to an exemplary embodiment may include a core layer 101, first metal layers 102 and 103 sequentially disposed on the core layer 101, a release layer 104 disposed on the first metal layers 102 and 103 (e.g., on an outermost layer of the first metal layers 102 and 103), and second metal layers 105 and 106 disposed on the release layer 104. The first metal layers 102 and 103 may cover an upper surface and side surface(s) of the core layer 101. The release layer 104 and the second metal layers 105 and 106 may be patterned on the first metal layers 102 and 103 to form a plurality of unit pattern portions 110A. The number of unit pattern portions 110A is not specifically limited, and a patterned form may also be different from that illustrated in the drawing. Respective unit pattern portions 110A may each include a release layer 104 and the second metal layers 105 and 106 disposed on the release layer 104. In addition, respective unit pattern portions 110A may have an area smaller than those of the core layer 101 and the first metal layers 102 and 103. Respective unit pattern portions 110A may be patterned to be disposed to be physically spaced apart from each other by a predetermined interval. As such, the carrier substrate 100A according to an exemplary embodiment may be designed to prevent separation through a unit pattern portion 110A. Thus, even in the case in which a sawing (Q) process is performed in unit of quad or strip, the release layer 104 may be prevented from being separated from the first metal layers 102 and 103 and/or the second metal layers 105 and 106. In addition, since an edge portion of the core layer 101 is protected by the first metal layers 102 and 103, durability may be improved. Since a step portion of the first metal layers 102 and 103 and the second metal layers 105 and 106 may be minimized, a thickness variation in a process of forming an interposer may be minimized.

The core layer 101 may be formed using a material having a higher level of flatness than that of a prepreg. For example, the core layer 101 may be provided as a glass plate. The glass plate has excellent flatness, as compared with the prepreg. Here, the glass plate is an amorphous solid including a glass component. In other words, glass of the glass plate is a material having a high degree of transparency obtained in such a manner that silica, sodium carbonate, calcium carbonate, or the like, is melted at a high temperature and cooled. The glass of the glass plate is different from an insulating material including a glass fiber or an inorganic filler in an insulating resin. The glass of the glass plate may be silicate glass, such as soda-lime glass, potash-lime glass, lead glass, barium glass, and silicate glass, a borosilicate glass, such as Pyrex and alumina glass, or phosphate glass, but is not limited thereto. For example, the glass may include a silicate component. Silicate may be formed by a combination of silica ($SiO_2$) and a metallic oxide, such as a boron oxide, a sodium oxide, an aluminum oxide, a barium oxide, a lithium oxide, a calcium oxide, and a zirconium oxide. In an exemplary embodiment, the glass plate may include a silicate component in which $SiO_2$ is combined with at least one metallic oxide among boron oxide ($B_2O_3$), sodium oxide ($Na_2O$), aluminum oxide ($Al_2O_3$), barium oxide (BaO), lithium oxide ($Li_2O$), calcium oxide (CaO), and zirconium oxide ($ZrO_2$), but is not limited thereto. A thickness of the core layer 101 may be within a range of 0.8 mm to 1.2 mm.

The first metal layers 102 and 103 may be provided as a sputtered metal. The first metal layers 102 and 103 may include a plurality of layers and may include, for example, a first titanium (Ti) layer 102 and a first copper (Cu) layer 103. However, a metal of the first metal layers 102 and 103 is not necessarily limited to Ti and/or Cu. Other well-known metals, such as aluminum (Al), silver (Ag), tin (Sn), gold (Au), nickel (Ni), lead (Pb), or alloys thereof, may be used. Thicknesses of respective layers forming the first metal layers 102 and 103 may be substantially equal. For example, each of the first Ti layer 102 and the first Cu layer 103 may have a thickness of 0.08 µm to 0.12 µm.

The release layer 104 may be provided as an inorganic release layer, in order to introduce stable detachable characteristics. For example, the release layer 104 may be formed using a carbon (C) material, but is not limited thereto. The carrier substrate 100A according to an exemplary embodiment may be designed to prevent separation through the unit pattern portion 110A, as described above. Thus, during the sawing (Q) process in a unit of a quad or a strip, the release layer 104 may be prevented from being separated. A thickness of the release layer 104 may be the thinnest, as compared with other layers 101, 102, 103, 105, and 106, and may be, for example, in a range of 0.002 µm to 0.004 µm.

The second metal layers 105 and 106 may also be provided as a sputtered metal. The second metal layers 105 and 106 may also include a plurality of layers and may include, for example, a second Ti layer 105 and a second Cu layer 106. However, a metal of the second metal layers 105 and 106 is not necessarily limited to Ti and/or Cu. Other well-known metals, such as Al, Ag, Sn, Au, Ni, Pb, or alloys thereof, may be used. Thicknesses of respective layers forming the second metal layers 105 and 106 may be different. For example, the second Ti layer 105 may have a thickness of 0.08 μm to 0.12 μm, while the second Cu layer 106 may have a thickness of 0.28 μm to 0.32 μm. As such, the thickness of the second Cu layer 106 of the two metal layers 105 and 106 may be greater than that of the first Cu layer 103 of the first metal layers 102 and 103, in order to have effective detachability and flatness.

Figure 10:
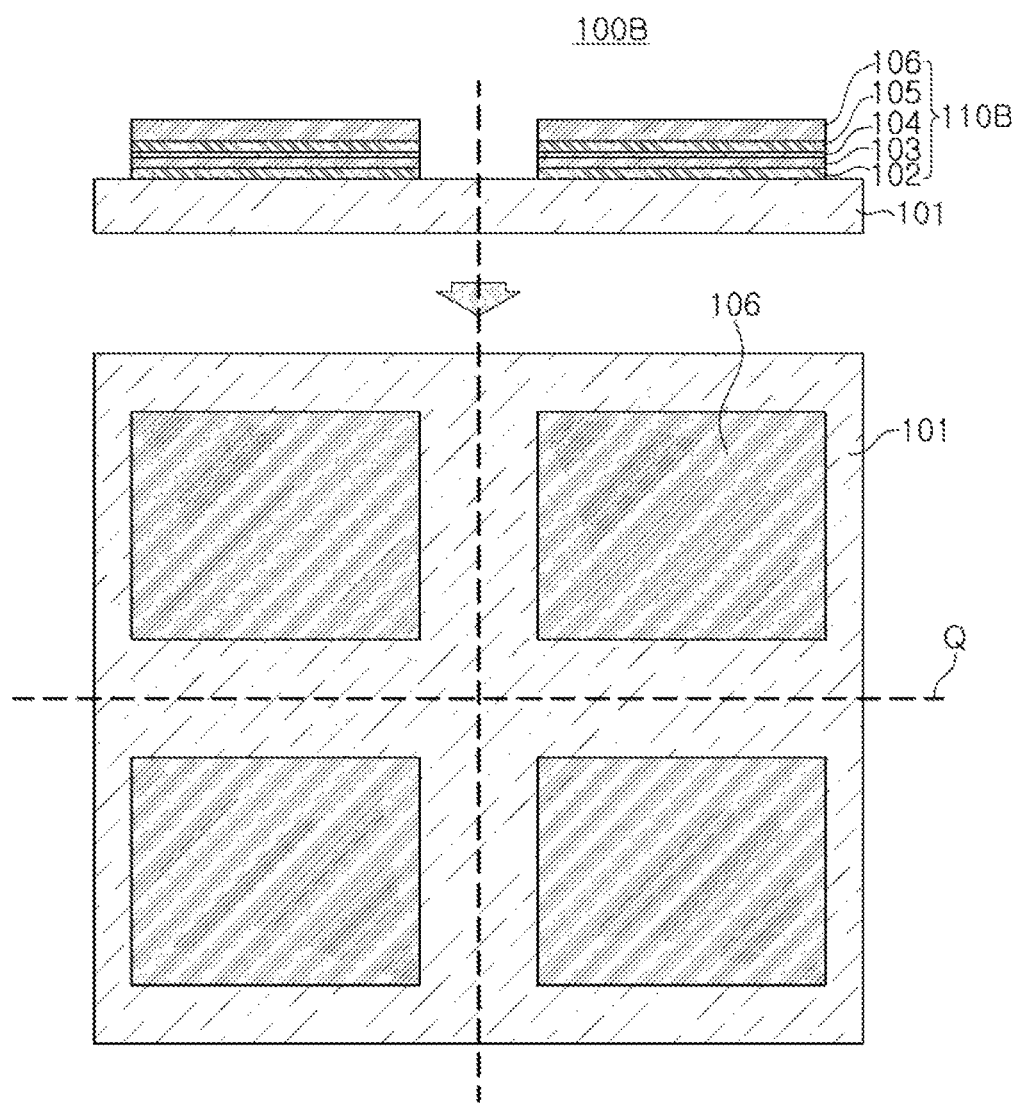
FIG. 10 is a schematic cross-sectional view and top view of another exemplary carrier substrate.

FIG. 10 is a schematic cross-sectional view and top view of another exemplary embodiment of a carrier substrate.

With reference to FIG. 10, a carrier substrate 100B according to another exemplary embodiment may include a core layer 101, first metal layers 102 and 103 disposed on the core layer 101, a release layer 104 disposed on the first metal layers 102 and 103, and second metal layers 105 and 106 disposed on the release layer 104. However, an entirety of the first metal layers 102 and 103, the release layer 104, and the second metal layers 105 and 106 may be patterned on the core layer 101 so as to form a plurality of unit pattern portions 110B. In other words, respective unit pattern portions 110B may include the first metal layers 102 and 103, the release layer 104, and the second metal layers 105 and 106. A portion of an upper surface and a side surface of the core layer 101 may be exposed from the first metal layers 102 and 103. Respective unit pattern portions 110B may have an area smaller than that of the core layer 101 and may be patterned to be disposed to be physically spaced apart from each other by a predetermined interval on the surface of the core layer 101. As such, the carrier substrate 100B according to another exemplary embodiment may be designed to prevent separation through a unit pattern portion 110B. Thus, even in the case in which a sawing (Q) process is performed in a unit of a quad or a strip, the release layer 104 may be prevented from being separated from the first metal layers 102 and 103 and/or the second metal layers 105 and 106. In addition, occurrence of an arc defect in a sputtering jig and in an edge portion of the core layer 101 when vacuum sputtering is performed may be fundamentally prevented. Since other descriptions of carrier substrate 100B are substantially the same as descriptions provided above in relation to carrier substrate 100A, detailed descriptions will be omitted.

Figure 11:
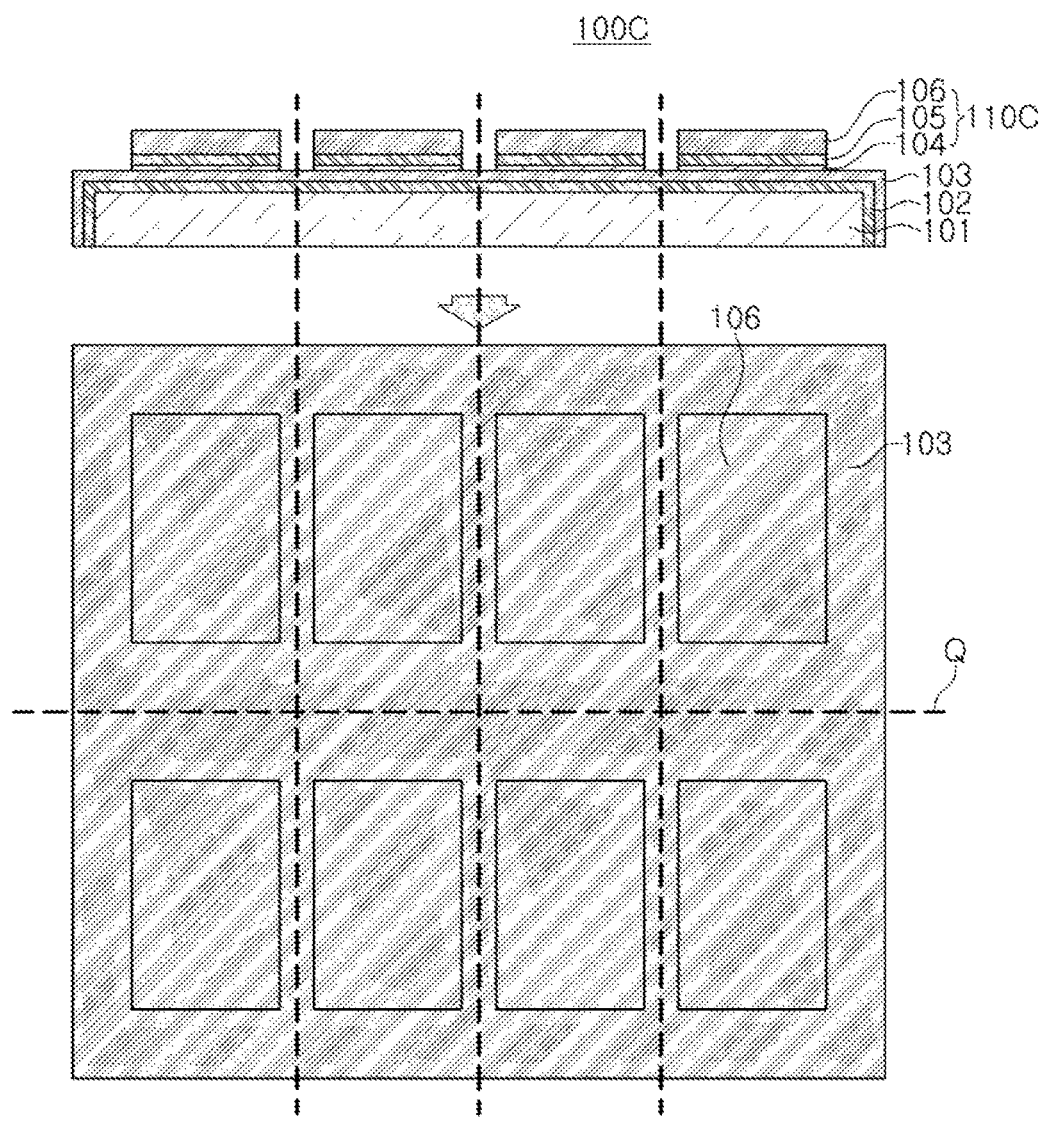
FIG. 11 is a schematic cross-sectional view and top view of another exemplary carrier substrate.

FIG. 11 is a schematic cross-sectional view and top view of another exemplary embodiment of a carrier substrate.

With reference to FIG. 11, a carrier substrate 100C according to another exemplary embodiment may include a core layer 101, first metal layers 102 and 103 disposed on the core layer 101, a release layer 104 disposed on the first metal layers 102 and 103, and second metal layers 105 and 106 disposed on the release layer 104. The first metal layers 102 and 103 may cover an upper surface and side surface (s) of the core layer 101. The release layer 104 and the second metal layers 105 and 106 may be patterned on the first metal layers 102 and 103 to form a plurality of unit pattern portions 110C. However, a unit pattern portion 110C may be formed in unit of strip. Respective unit pattern portions 110C may include the release layer 104 and the second metal layers 105 and 106. In addition, respective unit pattern portions 110C may have an area smaller than those of the core layer 101 and the first metal layers 102 and 103. Respective unit pattern portions 110C may be patterned to be disposed to be physically spaced apart from each other by predetermined intervals. As such, the carrier substrate 100C according to another exemplary embodiment may be designed to prevent separation through the unit pattern portion 110C. Thus, even in the case in which a sawing (Q) process is performed in unit of quad or strip, the release layer 104 may be prevented from being separated from the first metal layers 102 and 103 and/or the second metal layers 105 and 106. In addition, since an edge portion of the core layer 101 is protected by the first metal layers 102 and 103, durability may be improved. Since a step portion of the first metal layers 102 and 103 and the second metal layers 105 and 106 may be minimized, a thickness variation in a process of forming an interposer may be minimized. Since other descriptions thereof are substantially the same as descriptions above, detailed descriptions will be omitted.

Figure 12:
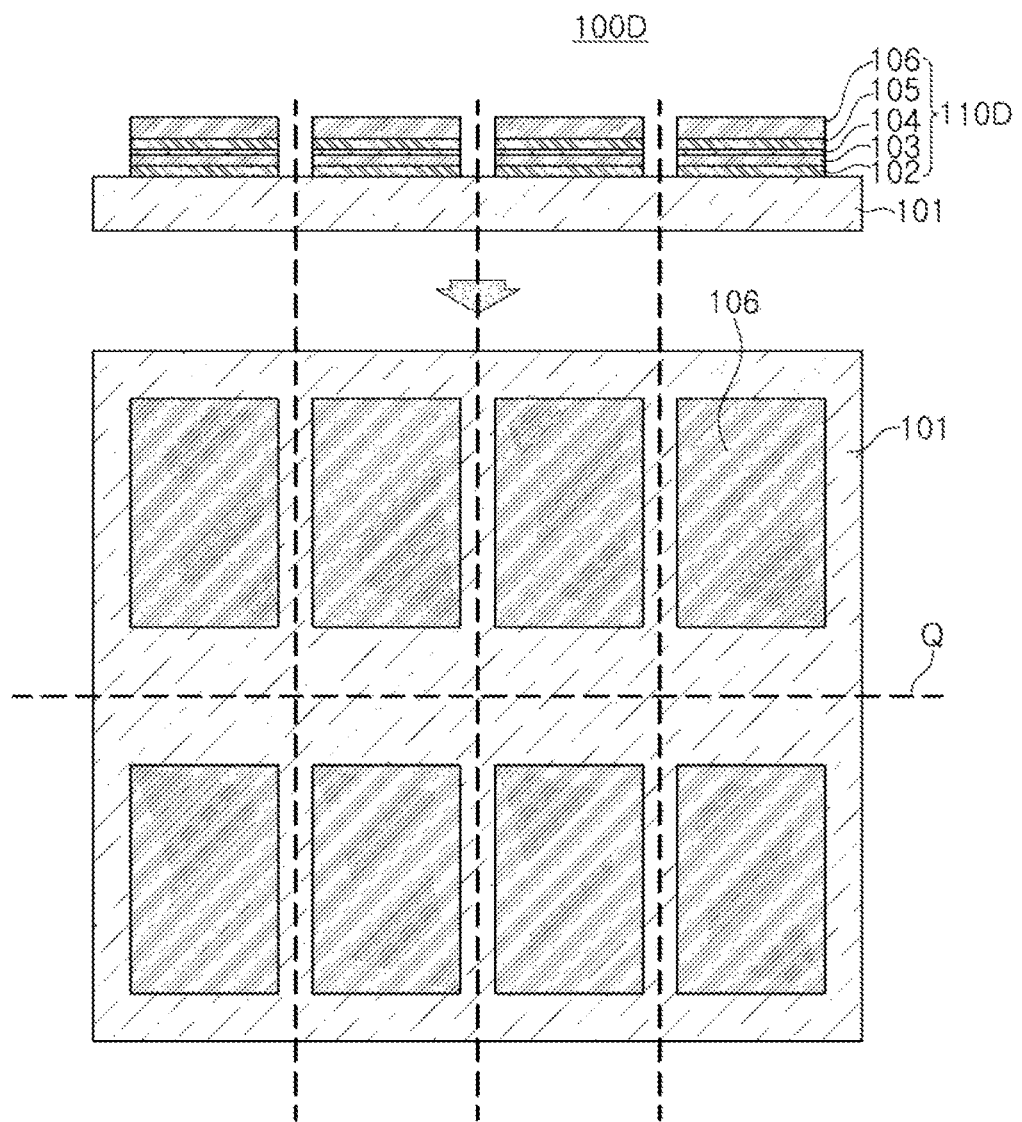
FIG. 12 is a schematic cross-sectional view and top view of another exemplary carrier substrate.

FIG. 12 is a schematic cross-sectional view and top view of another exemplary embodiment of a carrier substrate.

With reference to FIG. 12, a carrier substrate 100D according to another exemplary embodiment may include a core layer 101, first metal layers 102 and 103 disposed on the core layer 101, a release layer 104 disposed on the first metal layers 102 and 103, and second metal layers 105 and 106 disposed on the release layer 104. However, an entirety of the first metal layers 102 and 103, the release layer 104, and the second metal layers 105 and 106 may be patterned on the core layer 101 so as to form a plurality of unit pattern portions 110D. In other words, respective unit pattern portions 110D may include the first metal layers 102 and 103, the release layer 104, and the second metal layers 105 and 106. In addition, a unit pattern portion 110D may be formed in unit of strip. A portion of an upper surface and a side surface of the core layer 101 may be exposed from the first metal layers 102 and 103. Respective unit pattern portions 110D may have an area smaller than that of the core layer 101 and may be patterned to be disposed to be physically spaced apart from each other by predetermined interval(s). As such, the carrier substrate 100D according to another exemplary embodiment may be designed to prevent separation through the unit pattern portion 110D. Thus, even in the case in which a sawing (Q) process is performed in a unit of a quad or a strip, the release layer 104 may be prevented from being separated from the first metal layers 102 and 103 and/or the second metal layers 105 and 106. In addition, the occurrence of an arc defect in a sputtering jig and in an edge portion of the core layer 101 when a vacuum sputter is performed may be fundamentally prevented. Since other descriptions thereof are substantially the same as descriptions above, detailed descriptions will be omitted.

Figure 13:
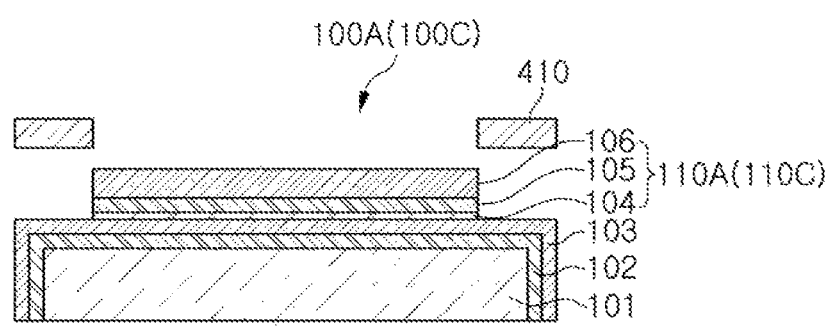
FIG. 13 is a schematic cross-sectional view of an exemplary method of manufacturing a carrier substrate.

FIG. 13 is a schematic cross-sectional view of an exemplary embodiment of a method of manufacturing a carrier substrate.

With reference to FIG. 13, a carrier substrate 100A according to an exemplary embodiment or a carrier substrate 100C according to another exemplary embodiment may be formed using a sputtered metal deposition method using a mask 410. For example, first metal layers 102 and 103 may be formed without the mask 410 after a core layer 101 is provided. The release layer 104 and second metal layers 105 and 106 may be formed using the mask 410, and a plurality of unit pattern portions 110A or 110C, having been patterned, may be formed, thereby forming the carrier substrate 100A or the carrier substrate 100C. A material of the mask 410 is not specifically limited.

Figure 14:
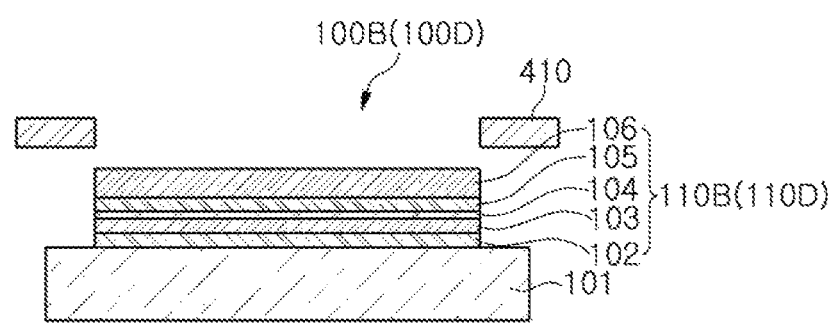
FIG. 14 is a schematic cross-sectional view of another exemplary method of manufacturing a carrier substrate.

FIG. 14 is a schematic cross-sectional view of another exemplary embodiment of a method of manufacturing a carrier substrate.

With reference to FIG. 14, a carrier substrate 100B according to an exemplary embodiment or a carrier substrate 100D according to another exemplary embodiment may be formed using a sputtered metal deposition method using a mask 410. For example, first metal layers 102 and 103, a release layer 104, and second metal layers 105 and 106 may be formed using the mask 410 after a core layer 101 is provided, and a plurality of unit pattern portions 110B or 110D, having been patterned, may be formed, thereby forming the carrier substrate 100B or the carrier substrate 100D. A material of the mask 410 is not specifically limited.

Figure 15:
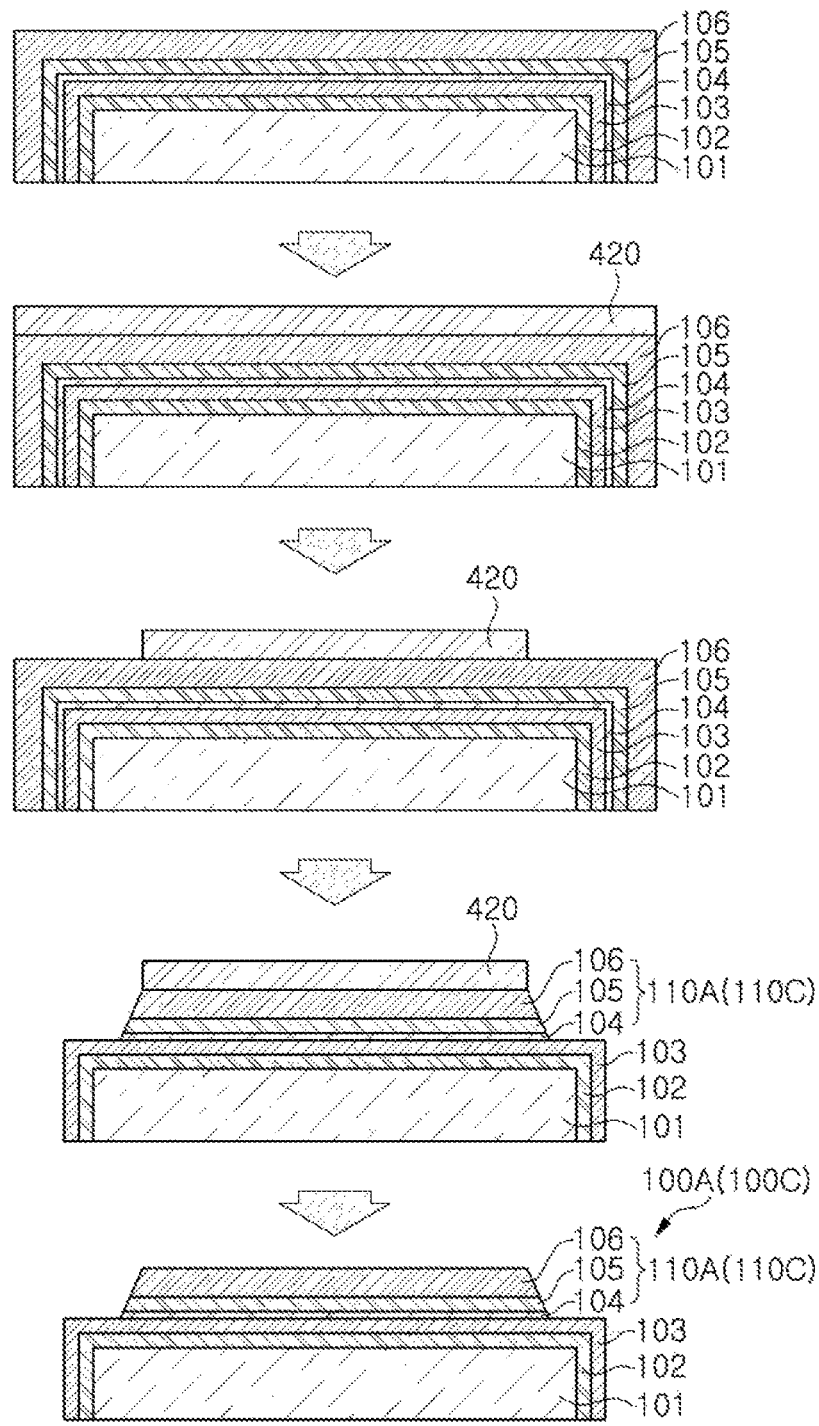
FIG. 15 is a schematic view of another exemplary method of manufacturing a carrier substrate.

FIG. 15 is a schematic view of another exemplary embodiment of a method of manufacturing a carrier substrate.

With reference to FIG. 15, a carrier substrate 100A according to an exemplary embodiment or a carrier substrate 100C according to another exemplary embodiment may also be formed using a lithography technique using a photoresist film 420, such as a dry film. For example, first metal layers 102 and 103, a release layer 104, and second metal layers 105 and 106 may be formed on a core layer 101 using sputtering or the like. A photoresist film 420 may be attached to the second metal layers 105 and 106, and the photoresist film 420 may be patterned using an exposure process and a development process. The release layer 104 and the second metal layers 105 and 106 may be patterned using a selective etching process, and the photoresist film 420 may be peeled off, thereby forming the carrier substrate 100A or the carrier substrate 100C. In the meantime, in this case, a wall surface of each unit pattern portion 110A or 110C may have an acute angle of inclination. In other words, each unit pattern portion 110A or 110C may have a tapered shape in which an upper surface is relatively narrow, and a lower surface is relatively wide.

Figure 16:
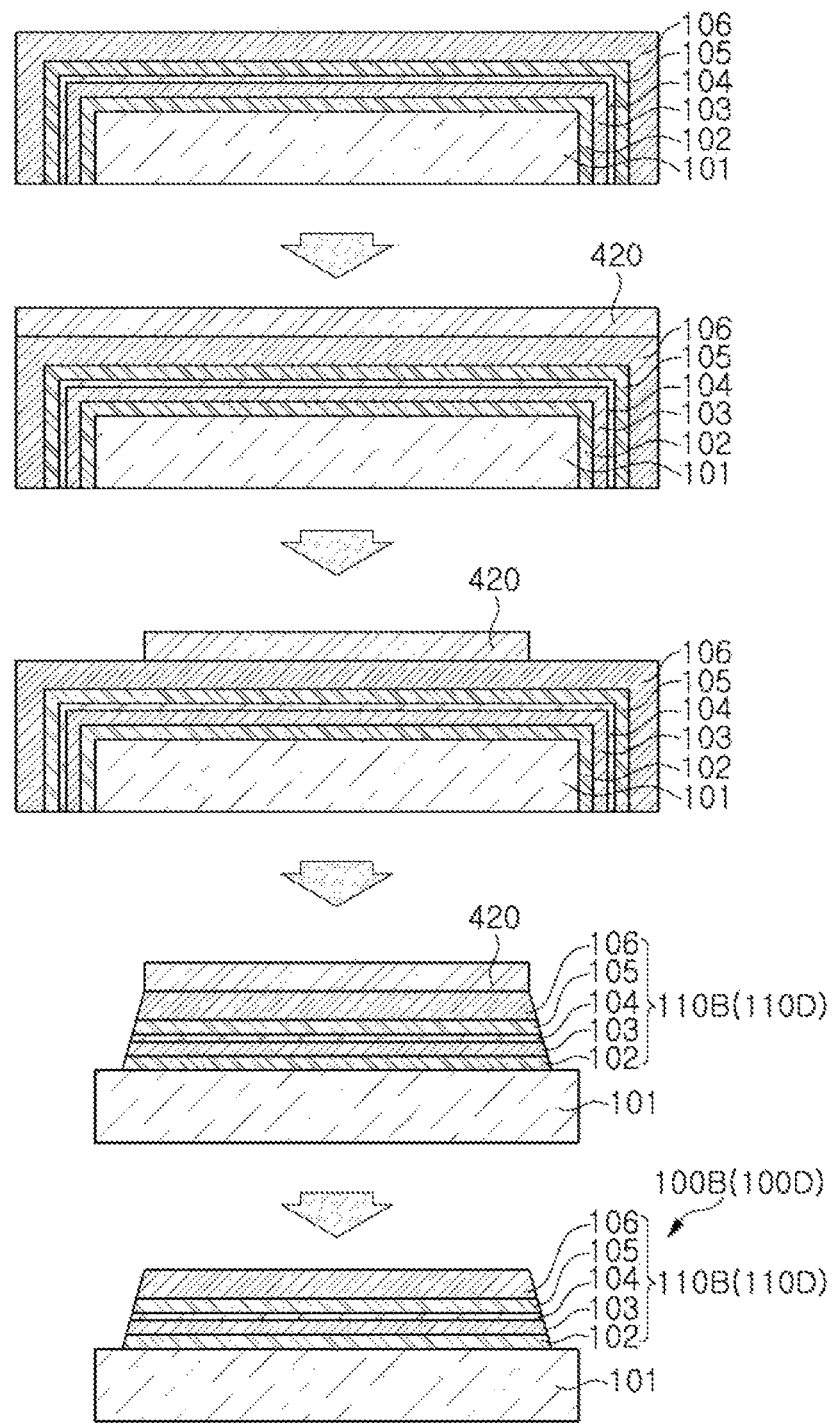
FIG. 16 is a schematic view of another exemplary method of manufacturing a carrier substrate.

FIG. 16 is a schematic view of another exemplary embodiment of a method of manufacturing a carrier substrate.

With reference to FIG. 16, a carrier substrate 100B according to an exemplary embodiment or a carrier substrate 100D according to another exemplary embodiment may also be formed using a lithography technique using a photoresist film 420, such as a dry film. For example, first metal layers 102 and 103, a release layer 104, and second metal layers 105 and 106 may be formed on a core layer 101 using sputtering or the like. A photoresist film 420 may be attached to the second metal layers 105 and 106, and the photoresist film 420 may be patterned using an exposure process and a development process. The first metal layers 102 and 103, the release layer 104, and the second metal layers 105 and 106 may be patterned using an etching process, and the photoresist film 420 may be peeled off, thereby forming the carrier substrate 100B or the carrier substrate 100D. In the meantime, in this case, a wall surface of each unit pattern portion 110B or 110D may also have an acute angle of inclination. In other words, each unit pattern portion 110B or 110D may have a tapered shape in which an upper surface is relatively narrow, and a lower surface is relatively wide.

Figure 17:
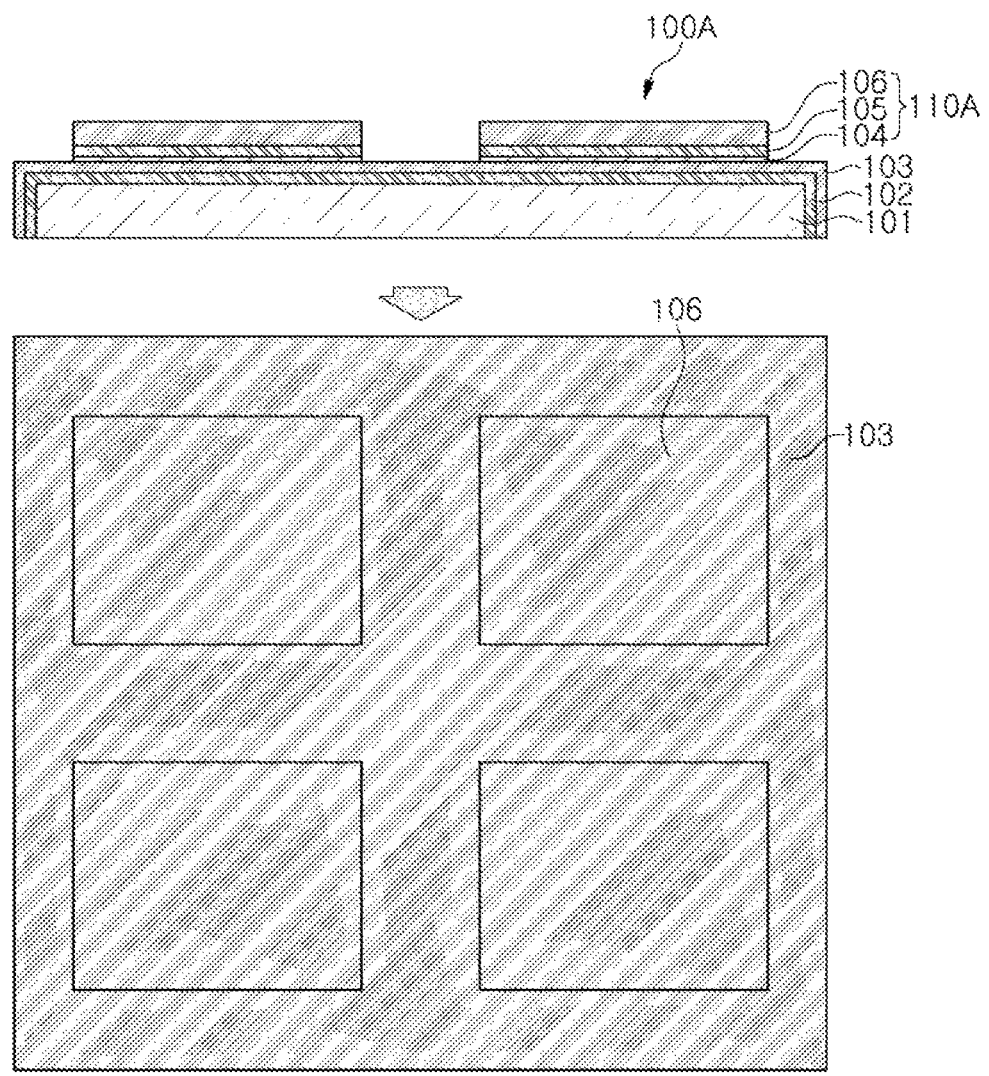
FIGS. 17 to 19 are schematic views of an exemplary method of manufacturing a semiconductor package using a carrier substrate according to an exemplary embodiment.
Figure 18:
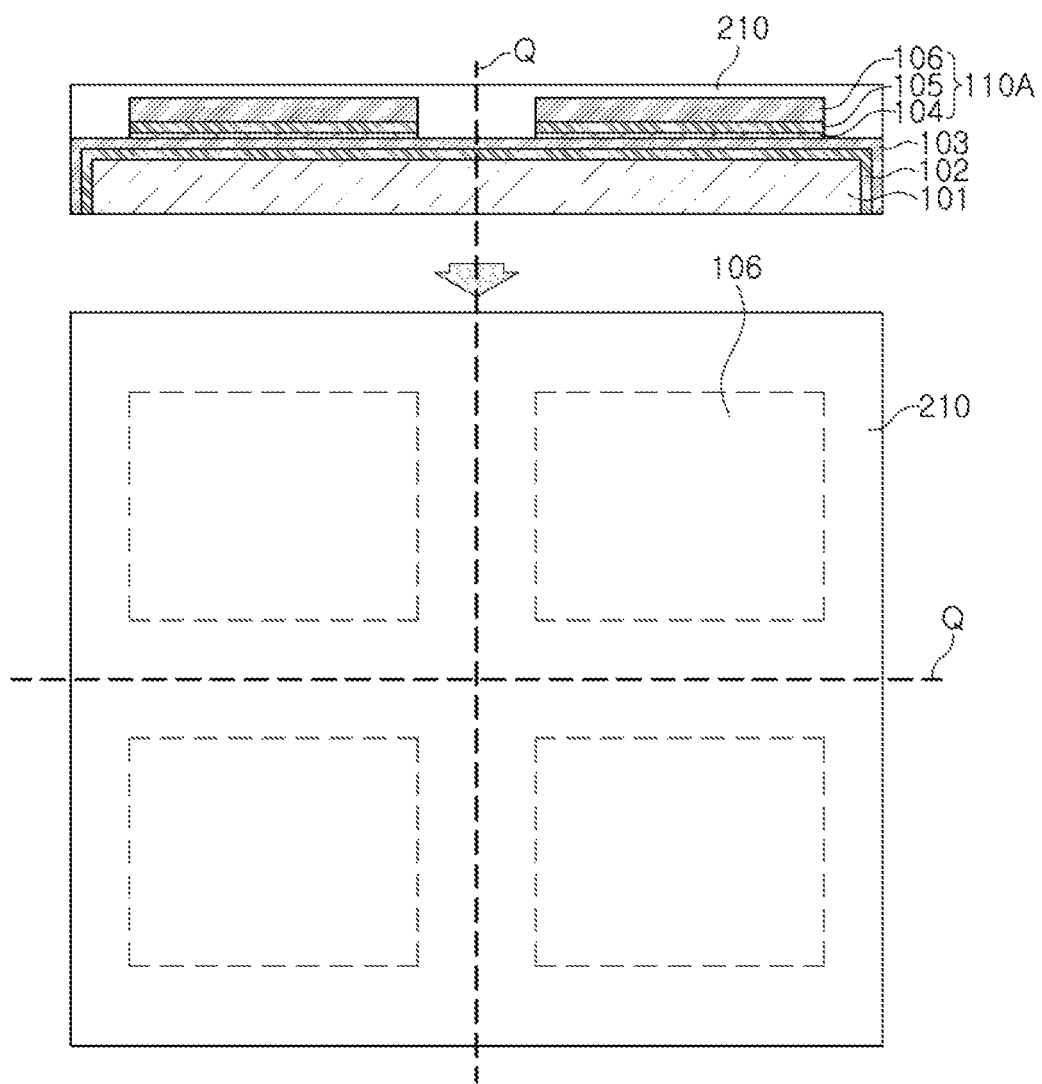
Figure 19:
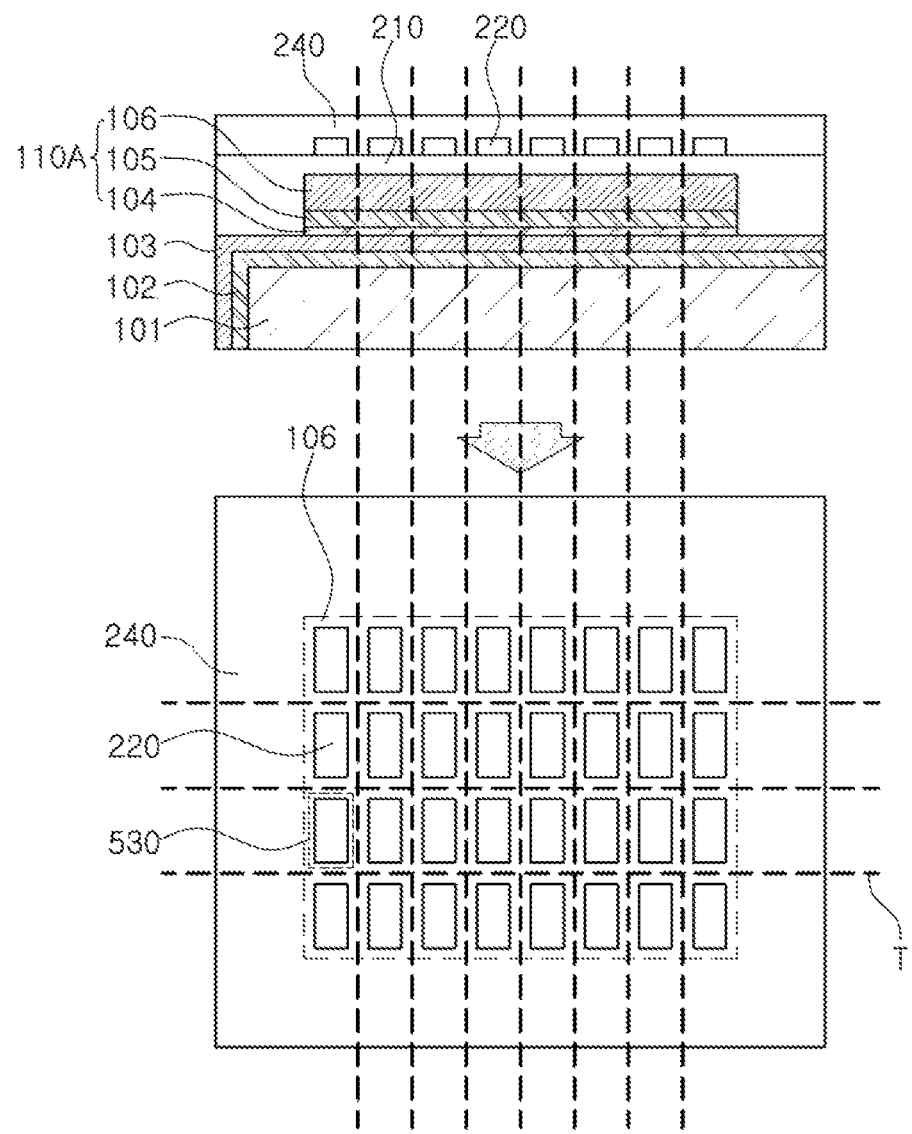

FIGS. 17 to 19 are schematic views of an exemplary embodiment of a method of manufacturing a semiconductor package using a carrier substrate according to an exemplary embodiment.

With reference to FIG. 17, a carrier substrate 100A according to an exemplary embodiment described above may first be provided. A carrier substrate 100B, 100C, or 100D according to another exemplary embodiment may also or alternatively be used.

With reference to FIG. 18, subsequently, an interposer 210 including an insulating layer, a wiring layer, and a via electrode may be formed on a plurality of unit pattern portions 110A. After the interposer 210 is formed, an electrical inspection of the wiring layer may be performed. Subsequently, a sawing (Q) process may be performed to form a quad or strip from a panel. The sawing (Q) process may be performed in such a manner that the carrier substrate 100A and the interposer 210 are cut so as to isolate unit pattern portions 110A from each other. As described above, the carrier substrate 100A according to an exemplary embodiment may be designed to prevent separation. Thus, the carrier substrate 100A may be prevented from being separated during the sawing (Q) process.

With reference to FIG. 19, subsequently, a plurality of semiconductor chips 220 may be disposed on respective interposers 210, having been sawn (Q). Subsequently, an encapsulant 240 encapsulating the plurality of semiconductor chips 220 may be formed on respective interposers 210, having been sawn (Q). Subsequently, each carrier substrate 100A, each unit pattern portion 110A, each interposer 210, having been sawn (Q), as well as the encapsulant 240, may be trimmed (T) so that one or more semiconductor chips 220 may be isolated from one or more further semiconductor chips, among the plurality of semiconductor chips. FIG. 19 illustrates that, for the sake of convenience, each semiconductor package 530 manufactured after being trimmed (T) includes a single semiconductor chip 220. However, each semiconductor package 530 may also include a plurality of semiconductor chips 220. In a case in which the carrier substrate 100A, having been sawn (Q) and trimmed (T), is separated from each semiconductor package 530 manufactured after being trimmed (T), a plurality of semiconductor packages 530 may be obtained. In the meantime, in separating the carrier substrate 100A, having been sawn (Q) and trimmed (T), the release layer 104 and the second metal layers 105 and 106 in each unit pattern portion 110A, having been sawn (Q) and trimmed (T), may be separated. The second metal layers 105 and 106 remaining in each interposer 210, having been sawn (Q) and trimmed (T), may be removed by an etching process.

As such, in a case in which a type of detachable glass carrier 100A having a specific pattern portion 110A is used, flatness thereof may be excellent. Thus, a microcircuit of the interposer 210 may be easily formed, and stable process driving performance may be secured in a quad level assembly process, while the detachable glass carrier 100A is not separated. In addition, in a case in which the detachable glass carrier 100A is manufactured to have the specific pattern portion 110A during processing of raw material, costs may be reduced, which is the same as a case in which a carrier substrate 100B, 100C, or 100D according to another exemplary embodiment is used.

Figure 20:
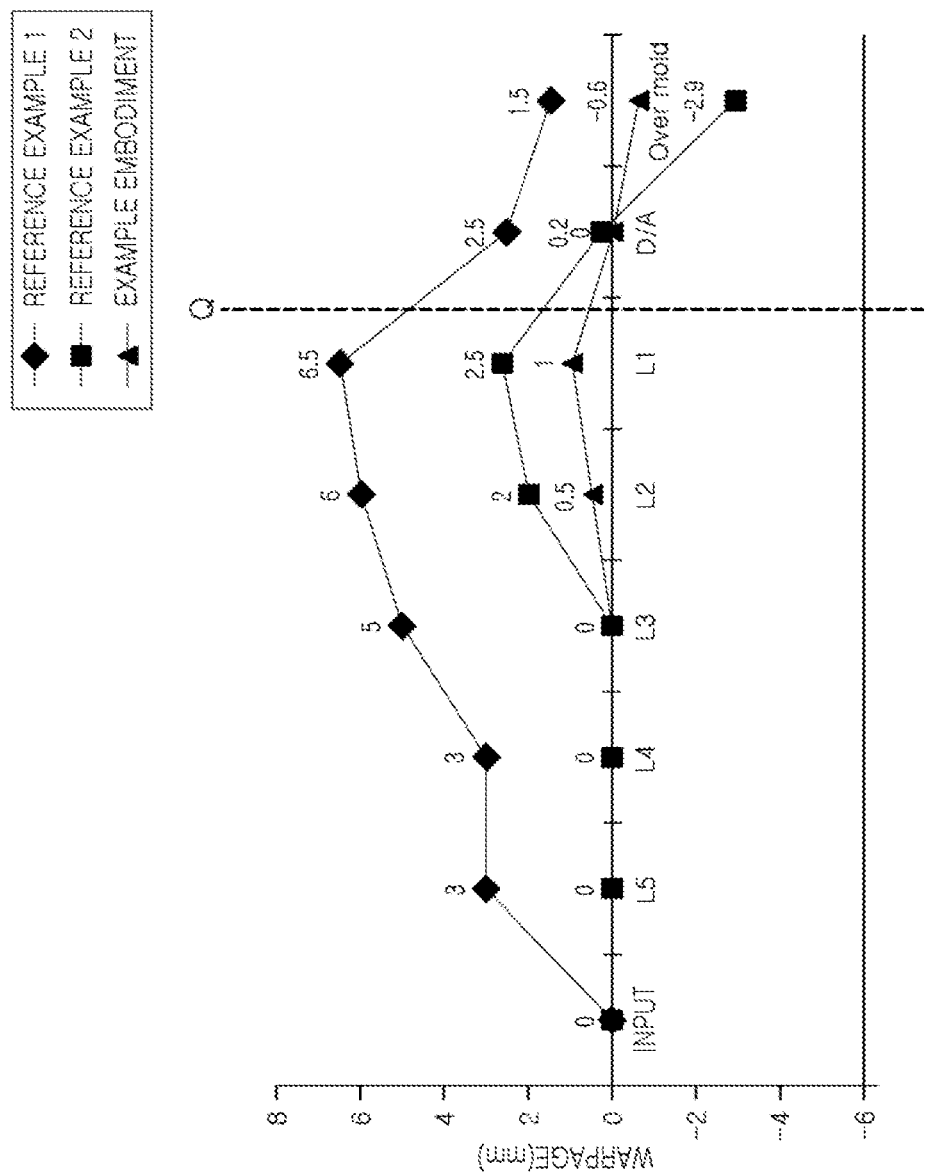
FIG. 20 is a graph illustrating a warpage improvement effect of a carrier substrate according to an exemplary embodiment.

FIG. 20 is a graph illustrating a warpage improvement effect of a carrier substrate according to an exemplary embodiment.

With reference to FIG. 20, the Example Embodiment illustrates a semiconductor package manufactured using a carrier substrate 100A, 100B, 100C, or 100D according to an exemplary embodiment. Respective Reference Examples 1 and 2 illustrate a semiconductor package manufactured using a copper clad laminate (CCL). It can be determined that manufacturing a semiconductor package using the carrier substrate 100A, 100B, 100C, or 100D according to an exemplary embodiment has stable process driving performance when a level of quad warpage by carrier is confirmed.

As set forth above, according to example embodiments of the present inventive concept, a carrier substrate securing stable process driving performance in a quad level assembly process while a carrier is not separated, and a method of effectively manufacturing a semiconductor package including an interposer having a microcircuit using the carrier substrate may be provided.

Spatially relative terms, such as "above," "upper," "below," and "lower" and the like, may be used herein for ease of description to describe one element's positional relationship relative to other element(s) in the illustrative orientation shown in the figures. It will be understood that spatially relative terms are intended to encompass different orientations of the device in use or operation, in addition to the orientation depicted in the figures. For example, if the device in the figures is turned over, elements described as "above" or "upper" relative to other elements would then be oriented "below" or "lower" relative to the other elements or features. Thus, the term "above" can encompass both the above and below orientations depending on a particular direction or orientation of the figures. The device may be otherwise oriented (rotated 90 degrees or at other orientations) and the spatially relative descriptors used herein may be interpreted accordingly.

Throughout the specification, it will be understood that when an element, such as a layer, region, or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

Embodiments of the present inventive concept have been described above with reference to schematic views illustrating embodiments of the present inventive concept. In the drawings, for example, due to manufacturing techniques and/or tolerances, modifications of the shape shown may be estimated. Thus, embodiments of the present inventive concept should not be construed as being limited to the particular shapes of regions shown herein, but should more broadly be understood to include, for example, a change in shape resulting from a manufacturing process. The following embodiments may also be constituted alone, in combination, or in partial combination.

The terminology used herein describes particular embodiments only, and the present inventive concept is not limited thereby. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, members, elements, and/or groups thereof, but do not preclude the presence or addition of one or more other features, integers, steps, operations, members, elements, and/or groups thereof.

While exemplary embodiments have been shown and described above, it will be apparent to those skilled in the art that modifications and variations could be made without departing from the scope of the present invention as defined by the appended claims.

What is claimed is:

1. A carrier substrate, comprising:
a core layer;
a first metal layer disposed on an upper surface of the core layer to integrally cover at least one first area of a surface of the core layer;
a second metal layer disposed in a plurality of unit pattern portions separate from each other in the at least one first area; and
a release layer disposed between the first and second metal layers to integrally cover an area of overlap between the first and second metal layers in each of the plurality of unit pattern portions,
wherein the release layer provides a detachable characteristic enabling each of the plurality of unit pattern portions of the second metal layer to be released from each other and from the core layer when the release layer is detached, and
wherein the release layer is disposed directly on the first metal layer, and the second metal layer is disposed directly on the release layer.

2. The carrier substrate of claim 1, wherein each of the plurality of unit pattern portions of the second metal layer are disposed to be physically spaced apart from each other by a predetermined interval.

3. The carrier substrate of claim 1, wherein the release layer is disposed as a plurality of unit pattern portions separate from each other and each having a corresponding unit pattern portion of the second metal layer disposed thereon, and the plurality of unit pattern portions has an area smaller than an area of the core layer.

4. The carrier substrate of claim 1, wherein the first metal layer covers an entirety of the upper surface and a side surface of the core layer.

5. The carrier substrate of claim 1, wherein the first metal layer covers each of a plurality of first areas separate from each other on the surface of the core layer.

6. The carrier substrate of claim 5, wherein a portion of an upper surface of the core layer is exposed between each of the plurality of first areas of the first metal layer.

7. The carrier substrate of claim 1, wherein the core layer is a glass plate.

8. The carrier substrate of claim 1, wherein each of the first metal layer and the second metal layer include a plurality of stacked layers.

9. The carrier substrate of claim 8, wherein each of the first metal layer and the second metal layer includes a stack of a titanium (Ti) layer and a copper (Cu) layer.

10. The carrier substrate of claim 9, wherein the Cu layer of the second metal layer is thicker than the Cu layer of the first metal layer.

11. The carrier substrate of claim 1, wherein the release layer is an inorganic release layer.

12. A carrier substrate, comprising:
a core layer;
at least one first metal layer disposed on the core layer; and
a plurality of unit pattern portions directly disposed on an upper surface of the at least one first metal layer to be spaced apart from each other, the at least one first metal layer being provided between the core layer and the plurality of unit pattern portions,
wherein each unit pattern portion includes a release layer and a metal layer disposed directly on a surface of the release layer facing away from the core layer and extending to integrally cover an area of the unit pattern portion,
the release layer extends to integrally cover an area of overlap between the metal layer and the core layer in each of the plurality of unit pattern portions, and
the release layer provides a detachable characteristic enabling each of the plurality of the unit pattern portions to be released from the core layer.

13. The carrier substrate of claim 12, wherein the metal layer in each unit pattern portion is separate from the metal layer in other unit pattern portions so as to be released from the metal layers in the other unit pattern portions when the release layer is detached.

14. The carrier substrate of claim 12, wherein the metal layer in each unit pattern portion is configured to have mounted thereto an interposer having at least one semiconductor chip disposed thereon.

15. The carrier substrate of claim 12, wherein the core layer is a glass plate.

16. The carrier substrate of claim 12, wherein the release layer extends on the core layer between adjacent unit pattern portions.

17. The carrier substrate of claim 12, wherein the at least one first metal layer covers an entirety of a surface of the core layer having the unit pattern portions thereon.

18. The carrier substrate of claim 12, wherein the at least one first metal layer includes two stacked first metal layers formed of different metals.

* * * * *